(12) United States Patent
Luo et al.

(10) Patent No.: US 8,856,697 B2
(45) Date of Patent: Oct. 7, 2014

(54) ROUTING ANALYSIS WITH DOUBLE PATTERN LITHOGRAPHY

(75) Inventors: Jianfeng Luo, Foster City, CA (US); Gang Chen, Milpitas, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/400,411

(22) Filed: Feb. 20, 2012

(65) Prior Publication Data

US 2012/0216157 A1 Aug. 23, 2012

Related U.S. Application Data

(60) Provisional application No. 61/446,019, filed on Feb. 23, 2011, provisional application No. 61/477,768, filed on Apr. 21, 2011.

(51) Int. Cl.
*G06F 17/50* (2006.01)

(52) U.S. Cl.
CPC ................................. *G06F 17/5077* (2013.01)
USPC .................................. 716/55; 716/52; 716/53

(58) Field of Classification Search
USPC .......................................................... 716/55
See application file for complete search history.

(56) References Cited

U.S. PATENT DOCUMENTS

| | | | |
|---|---|---|---|
| 6,114,082 A | 9/2000 | Hakey et al. | |
| 7,808,053 B2 | 10/2010 | Haller et al. | |
| 7,856,613 B1 | 12/2010 | Weling et al. | |
| 2008/0134130 A1* | 6/2008 | Baum et al. | 716/21 |
| 2008/0307381 A1* | 12/2008 | Tritchkov et al. | 716/11 |
| 2010/0100947 A1* | 4/2010 | Ciet et al. | 726/6 |
| 2010/0229145 A1* | 9/2010 | Sahouria et al. | 716/19 |
| 2011/0003254 A1 | 1/2011 | Chang et al. | |

OTHER PUBLICATIONS

"An (almost) Linear Time Algorithm for Odd Cycles Transversal," by Ken-ichi Kawarabayashi and Bruce Reed, SODA '10 Proceedings of the Twenty-First Annual ACM-SIAM Symposium on Discrete Algorithms, pp. 365-378, ISBN: 978-0-898716-98-6.

"Layout Decomposition for Double Patterning Lithography," by Kahng, Andrew B. et al., IEEE/ACM International Conference on Computer-Aided Design, 2008 (ICCAD 2008), pp. 465-472, ISBN: 978-1-4244-2819-9.

"A Matching Based Decomposer for Double Patterning Lithography," by Yue Xu and Chris Chu, ACM ISPD '10 Proceedings of the 19th international symposium on Physical design, pp. 121-126, ISBN: 978-1-60558-920-6.

"Seeing Double," by Chris A. Mack, IEEE Spectrum, pp. 46-51, ISSN : 0018-9235, Nov. 2008.

"Fast and Efficient Phase Conflict Detection and Correction in Standard-Cell Layouts," by C. Chiang, et al., IEEE/ACM International Conference on Computer-Aided Design-ICCAD-2005, pp. 149-156, ISBN: 0-7803-9254-X.

\* cited by examiner

*Primary Examiner* — Paul Dinh
*Assistant Examiner* — Bryce Aisaka
(74) *Attorney, Agent, or Firm* — Adams Intellex, PLC

(57) ABSTRACT

Graph analysis for double pattern lithography is described. Layout shapes are decomposed into rectangles and a vertex is provided for each rectangle. Double pattern spacing conflicts are determined and shown as edges for the graph analysis. Odd cycles are used to identify double pattern lithography violations. Cycles can be completed with the addition of edges between vertices where stitches have been included in the layout. Edges between touching shapes do not count toward the odd count in the cycles. Fixes are included by increasing space or by rerouting. A portion of the layout can be incrementally changed and a local update of the graph analysis performed. Correct by construction layout is implemented by avoiding certain odd cycle prone layout routings.

27 Claims, 11 Drawing Sheets

ROUTING ANALYSIS WITH DOUBLE PATTERN LITHOGRAPHY

RELATED APPLICATIONS

This application claims the benefit of U.S. provisional patent applications "Routing Analysis with Double Pattern Lithography" Ser. No. 61/446,019, filed Feb. 23, 2011 and "Double Pattern Lithography Routing" Ser. No. 61/477,768, filed Apr. 21, 2011. Each of the foregoing applications is hereby incorporated by reference in its entirety.

FIELD OF INVENTION

This application relates generally to circuit design and more particularly to routing analysis with the use of double pattern lithography.

BACKGROUND

Integrated circuit design and fabrication is a vastly complex effort and involves interaction between numerous steps in a manufacturing process. While going through the various steps in the design process, an understanding is required of the limitations of the manufacturing process. Shapes must be designed which can be fabricated so that the desired electronic circuit function is implemented at the resulting end of fabrication. Frequently, millions and even hundreds of millions of transistors can exist on a single semiconductor chip. Each transistor is composed of shapes for diffusion, polysilicon, contacts, metallization, and other structures. The ability to design chips with such large numbers of essential transistors can be quite challenging and optimization of the circuitry as needed can be a daunting task even with the help of electronic design automation (EDA) software tools.

There are numerous metal lines of miniscule dimension in close proximity to one another on each semiconductor chip. Further, there are diffusions, polysilicon shapes, and insulator layers, all of which must be fabricated to exacting tolerances. As technologies have advanced, smaller and smaller dimensions are used in lithography. These small dimensions can lead to challenges with rounded shapes as well as bridging and necking, all of which are problematic for solid and robust design implementation. Various solutions have been developed over the years for fabricating circuits with greater density including the implementation of dog bone shapes and other methods to cause the final resulting circuitry to be correct. As the various methods advanced many became collectively known as optical proximity correction. With further shrinkage in design dimensions, fabrication has required double pattern lithography where a single layer is fabricated using two separate masks.

SUMMARY

Double pattern lithography involves the printing of two sets of shapes on the same layout level in order to correctly fabricate the desired circuit structures. A computer implemented method for layout design is disclosed comprising: importing a layout for a layer within a semiconductor chip wherein the layout is comprised of two-dimensional polygons; decomposing the layout into rectangles; representing each of the rectangles as a vertex in a graph; representing relationships between the rectangles as edges in the graph; and identifying double pattern lithography violations using the edges in the graph. Only odd cycles may be used as part of the identifying. The method may further comprise representing a conflict between two polygons as an edge with a first line type in the graph. The conflict may include a double pattern spacing conflict in the layout. Odd cycles may have an odd number of edges with the first line type. The first line type may include a solid edge. The method may further comprise representing contact of a pair of rectangles decomposed from a single polygon with an edge with a second line type in the graph. The second line type may include a dashed edge. The edge with a second line type may be included while traversing a cycle from the graph. Only edges with the first line type may be counted to determine that a cycle is odd. The edges with the second line type may contact vertices representing each of the pair of rectangles. The vertices may be at center points for each of the pair of rectangles. The vertices may be at a boundary of each of the pair of rectangles. The edges within the graph may be traversed in a clockwise fashion. The next edge may be chosen for graph traversal based on the next edge being the next rightmost edge. In some embodiments, the next edge may be chosen for graph traversal based on the next edge being a next leftmost edge and wherein edges within the graph are traversed in an anticlockwise fashion. The method may further comprise traversing each edge in the graph a total of two times. The two times that each edge in the graph is traversed may be opposite directions. The identifying may further comprise identifying a plurality of conflict cycles in the layout. The plurality of conflict cycles may include a set of the smallest possible conflict cycles. The layout may be for a 20 nm or smaller lithography. The identifying may further comprise performing a linear search for the double pattern lithography conflicts. The method may further comprising fixing one or more of the double pattern lithography conflicts by increasing spacing between two of the rectangles that were decomposed from the layout. The method may further comprise fixing one or more of the double pattern lithography conflicts by rerouting a shape from the layout that was decomposed into rectangles. The vertex for each of the rectangles may be at a center point for each of the rectangles. The method may further comprise performing an incremental change on a portion of the layout and performing a local update of the graph.

In some embodiments, a computer program product embodied in a non-transitory computer readable medium for layout design may comprise: code for importing a layout for a layer within a semiconductor chip wherein the layout is comprised of two-dimensional polygons; code for decomposing the layout into rectangles; code for representing each of the rectangles as a vertex in a graph; code for representing relationships between the rectangles as edges in the graph; and code for identifying double pattern lithography violations using the edges in the graph. In embodiments, a computer system for layout design may comprise: a memory for storing instructions; one or more processors attached to the memory wherein the one or more processors are configured to: import a layout for a layer within a semiconductor chip wherein the layout is comprised of two-dimensional polygons; decompose the layout into rectangles; represent each of the rectangles as a vertex in a graph; represent relationships between the rectangles as edges in the graph; and identify double pattern lithography violations using the edges in the graph.

In embodiments, a computer implemented method for routing may comprise: importing a netlist for a semiconductor circuit; and performing routing for the netlist wherein the routing is based on double pattern lithography rules wherein the routing may avoid odd jogs. The routing may include detail routing. The method may further comprise performing global routing for the netlist before the detail routing is performed. The routing may avoid end-to-end double pattern spacing. The method may further comprise developing a weighting function used to bias the routing away from double pattern lithography conflicts. The method may further comprise determining constraints in the routing. The method may further comprise performing design rule checking on the layout after routing is performed. The method may further comprise performing odd cycle detection on layout of the netlist after the routing is performed. The method may further comprise marking odd cycles which were detected. The method may further comprise ripping up a portion of the layout where the odd cycles were marked. The method may further comprise adjusting a constraint on the routing. The method may further comprise adjusting a blockage for the routing. The method may further comprise repeating the routing based on the double pattern lithography rules. The odd cycle detection may comprise: decomposing the layout into rectangles; representing each of the rectangles as a vertex in a graph; representing relationships between the rectangles as edges in the graph; and identifying double pattern lithography violations using the edges in the graph. In some embodiments, a computer program product embodied in a non-transitory computer readable medium for routing may comprise: code for importing a netlist for a semiconductor circuit; and code for performing routing for the netlist wherein the routing is based on double pattern lithography rules and wherein the routing avoids odd jogs. In embodiments, a computer system for layout design may comprise: a memory for storing instructions; one or more processors attached to the memory wherein the one or more processors are configured to: import a netlist for a semiconductor circuit; and perform routing for the netlist wherein the routing is based on double pattern lithography rules and the routing avoids odd jogs.

Various features, aspects, and advantages of numerous embodiments will become more apparent from the following description.

BRIEF DESCRIPTION OF THE DRAWINGS

The following detailed description of certain embodiments may be understood by reference to the following figures wherein.

DETAILED DESCRIPTION

The present disclosure provides a description of various methods, systems, and apparatus associated with routing analysis for semiconductor on-chip circuitry where double pattern lithography is used. With smaller fabrication geometries, printing the needed layout shapes becomes problematic. One solution is to use two different masks for fabricating a single layer in a semiconductor chip. If a single mask is used with very small geometries, the different shapes that are in close proximity can blur or blend into one another and the proper shapes not be fabricated. A double pattern conflict indicates where double pattern lithography is required. If there is no double pattern conflict between two shapes then the two shapes can be fabricated using a single mask. The ability to fabricate a double pattern conflict with two masks depends on the presence of other double pattern conflicts in the layout. A conflict cycle graph can be constructed showing the relationship between various double pattern conflicts. When a conflict cycle in the graph has an odd number of edges, then a double pattern violation occurs. An odd number of edges indicates that two masks cannot be used to successfully fabricate the layout shapes represented in the graph. In this case a modification of the layout is required to eliminate the odd cycle situation.

Figure 1:
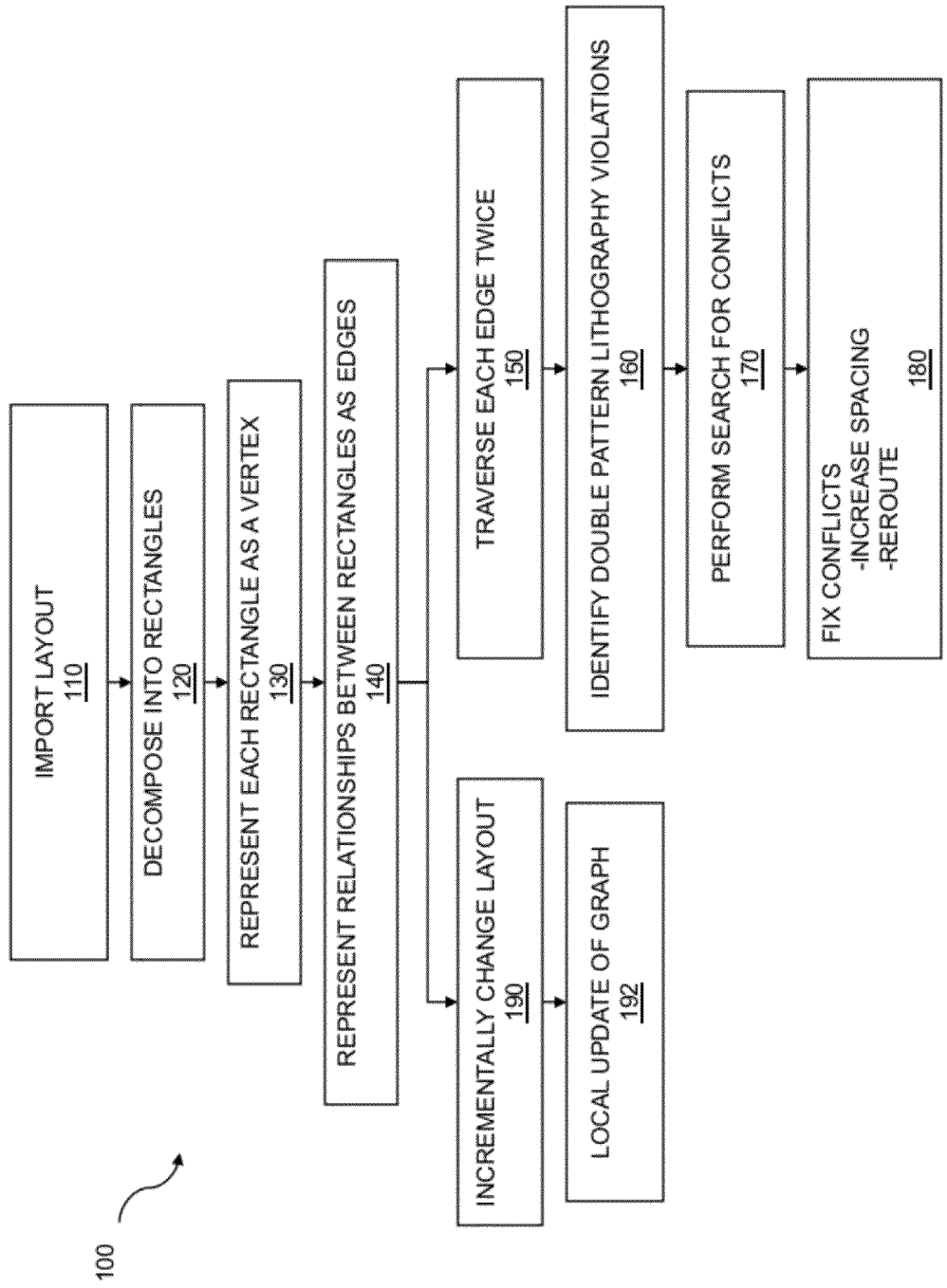
FIG. 1 is a flowchart for violation identification.

FIG. 1 is a flowchart for violation identification. A flow 100 is described for a computer implemented method for layout design. The flow 100 begins with importing a layout 110 for a layer within a semiconductor chip wherein the layout is comprised of two-dimensional polygons. The layout may be in the form of GDSII or OASIS or some other format for describing various shapes, sizes, and relationships of elements in a semiconductor layout. The layout may be for a semiconductor chip or die. The layout may be imported into a database to be included with other information about the chip. All chip layers may be imported, a subset of the chip layers, or only a single layer. In some embodiments, the layout may already reside within a software tool and importing may be construed as using a layout already present in the tool. The flow 100 continues with decomposing the layout into rectangles 120. Each shape may be represented by one or more rectangles. For example, an "L" shape may be represented by two abutting rectangles. The flow 100 continues with representing each of the rectangles as a vertex 130 in a graph. The vertex may be at the center of a rectangle, along an edge, or somewhere else within the rectangle. The flow 100 continues with representing relationships between the rectangles as edges in the graph 140. In some embodiments, a double pattern lithography conflict between two rectangles may be represented by a solid edge in the graph between the two vertices associated with the two rectangles. In embodiments, two rectangles which are touching each other may have a dotted line edge in the graph between the two vertices associated with the two rectangles that are touching. The flow 100 may include traversing each edge 150 in the graph a total of two times. The two times that the each edge in the graph is traversed are in opposite directions. A cycle within the graph may be traversed in a clockwise direction, for example. The next cycle, which shares an edge with the previous cycle, may be traversed in a clockwise direction as well. In this case the common edge is traversed in opposite directions when these two cycles are traversed. In some embodiments, when an edge contacts a vertex in a rectangle at a boundary of the chip, a connection can be assumed to some other rectangle on a boundary of the chip which is far away. This assumed connection is useful for analyzing shapes at the boundaries. The assumed connection is not used in counting toward an odd cycle violation. The flow 100 continues with identifying double pattern lithography conflicts 160 using the edges in the graph where the edges form a cycle. When an odd number of edges are traversed within a cycle then a double pattern lithography violation occurs. When an even number of edges are traversed then there is no double pattern lithography violation occurs and these shapes can be fabricated using two masks.

A search may be performed for conflicts 170. In some embodiments, the identifying further comprises performing a linear search for the double pattern lithography conflicts. In embodiments, the flow 100 further comprises fixing one or more of the double pattern lithography conflicts 180 by increasing spacing between two of the rectangles that were decomposed from the layout. In embodiments, the flow further comprises fixing one or more of the double pattern lithography conflicts by rerouting a shape from the layout that was decomposed into rectangles. In some cases it is possible to break a vertex into two separate vertices because two separate shapes have been implemented in the layout. In some embodiments, the flow 100 further comprises performing an incremental change on a portion of the layout 190 and performing a corresponding local update of the graph 192. In embodiments, the incremental change 190 may occur after other conflicts are fixed 180. A design rule check (DRC) may be performed as the layout is incrementally changed or as conflicts are fixed. In some embodiments, the layout must be DRC clean before a change is committed into the layout. If the layout is not DRC clean, or is not improved over a prior version of the layout from a DRC perspective, the layout may be returned to a previous level or a further change may be attempted before committing the change. Various layout change candidates may be evaluated for DRC cleanness and for double pattern lithography violations.

Figure 2:
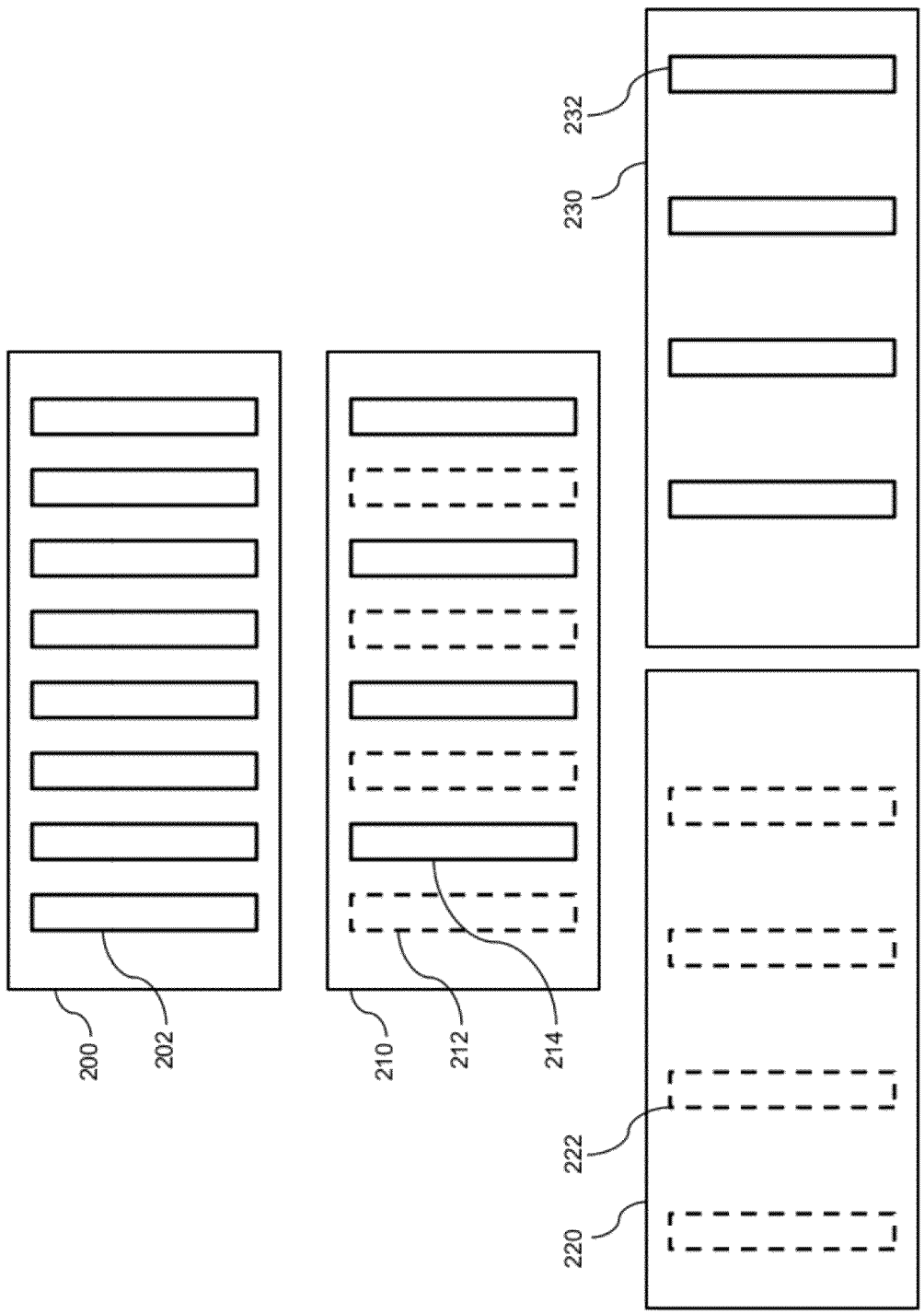
FIG. 2 is a diagram showing example double pattern decomposition.

FIG. 2 is a diagram showing example double pattern decomposition. An initial intended routing 200 is shown with a plurality of lines 202 shown. These lines 202 may be metal, polysilicon, or other fabrication layer within the layout. The routing 200 is decomposed into an alternative form 210. The lines 202 have been decomposed into a first set of lines 212 and a second set of lines 214. In form 210, every other line belongs to either the first set of lines 212 or the second set of lines 214. Two masks may be produced in order to fabricate the desired lines 202. A first mask 220 may contain a first set of lines 222 which reflect the first set of lines 212. A second mask 230 may contain a second set of lines 232 which reflect the second set of lines 214.

Figure 3:
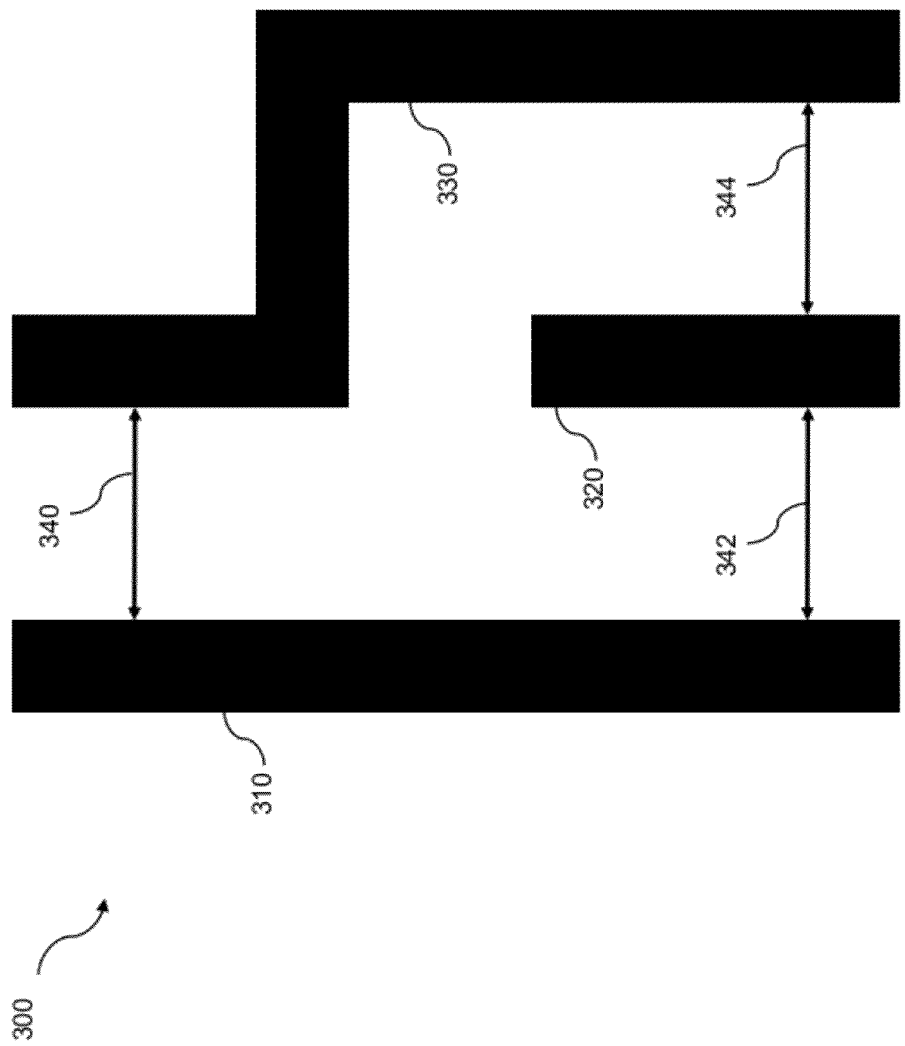
FIG. 3 is a diagram showing an example of odd cycle detection.

FIG. 3 is a diagram showing an example of odd cycle detection. A layout 300 is shown containing a first line 310, a second line 320, and a third line 330. These lines may be metal, polysilicon, or other fabrication layer with the layout. Design rule checking (DRC) may be performed to identify any conflicts in the layout. A conflict includes a double pattern spacing concern in the layout. Three double pattern lithography spacing conflicts are shown. A first conflict 340 between the first line 310 and the third line 330 exists. A second conflict 342 between the first line 310 and the second line 320 exists. A third conflict 344 between the second line 320 and the third line 330 exists. According to graph theory with regards to double pattern lithography, an even number of conflicts can be fixed with two masks but an odd number of conflicts cannot. Such an odd number of conflicts is considered an odd cycle violation. Therefore, only odd cycles are used as part of the identifying process. A cycle is a closed loop path connecting a set of conflicts. Odd cycle violations thus have an odd number of edges or conflicts. In the example from FIG. 3, the first conflict 340, the second conflict 342, and the third conflict 344 form an odd cycle violation.

Figure 4:
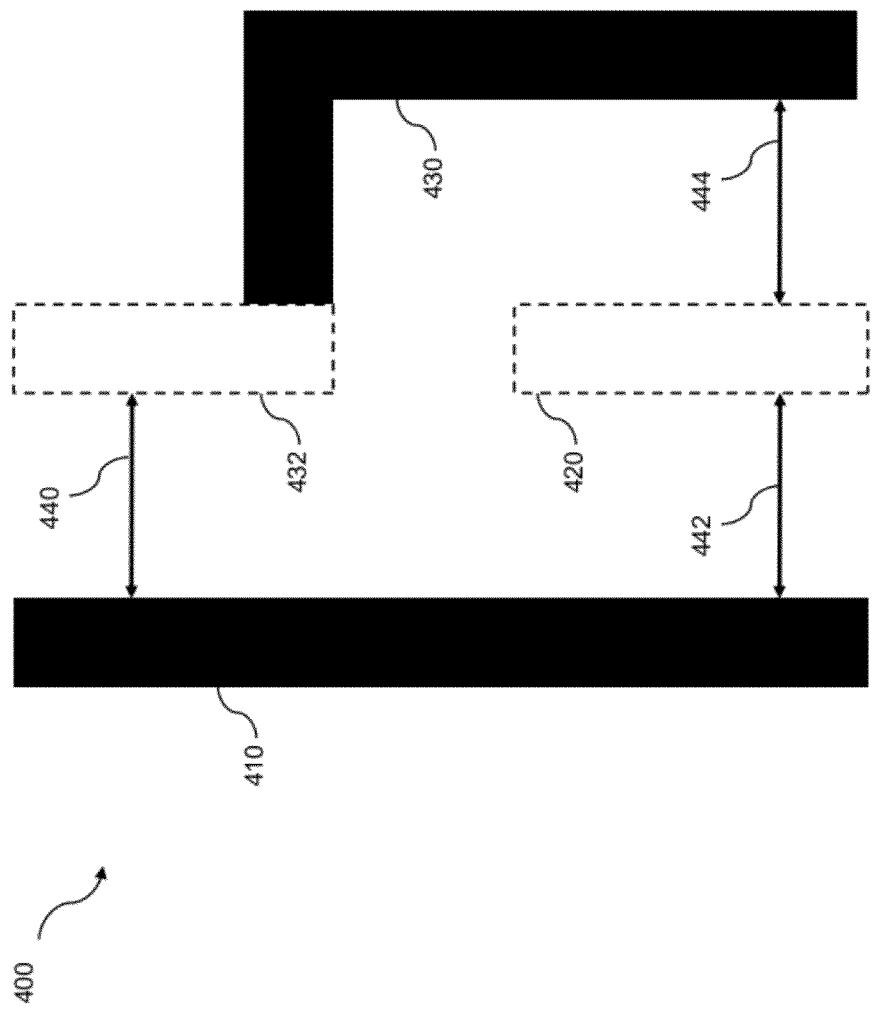
FIG. 4 is a diagram showing an example stitch.

FIG. 4 is a diagram showing an example stitch for the same layout as shown in FIG. 3. A layout 400 is shown containing a first line 410, a second line 420, and a third line 430 which is attached to a fourth line 432. These lines may be metal, polysilicon, or other fabrication layer within the layout. Three double pattern lithography spacing conflicts are shown. A first conflict 440 between the first line 410 and the fourth line 432 exists. A second conflict 442 between the first line 410 and the second line 420 exists. A third conflict 444 between the second line 420 and the third line 430 exists. A stitch is formed at the connection point between the second line 430 and the fourth line 432. By fabricating the second line 420 and the fourth line 432 with one mask and first line 410 and third line 430 with another mask, the double pattern lithography problems are avoided.

Figure 5:
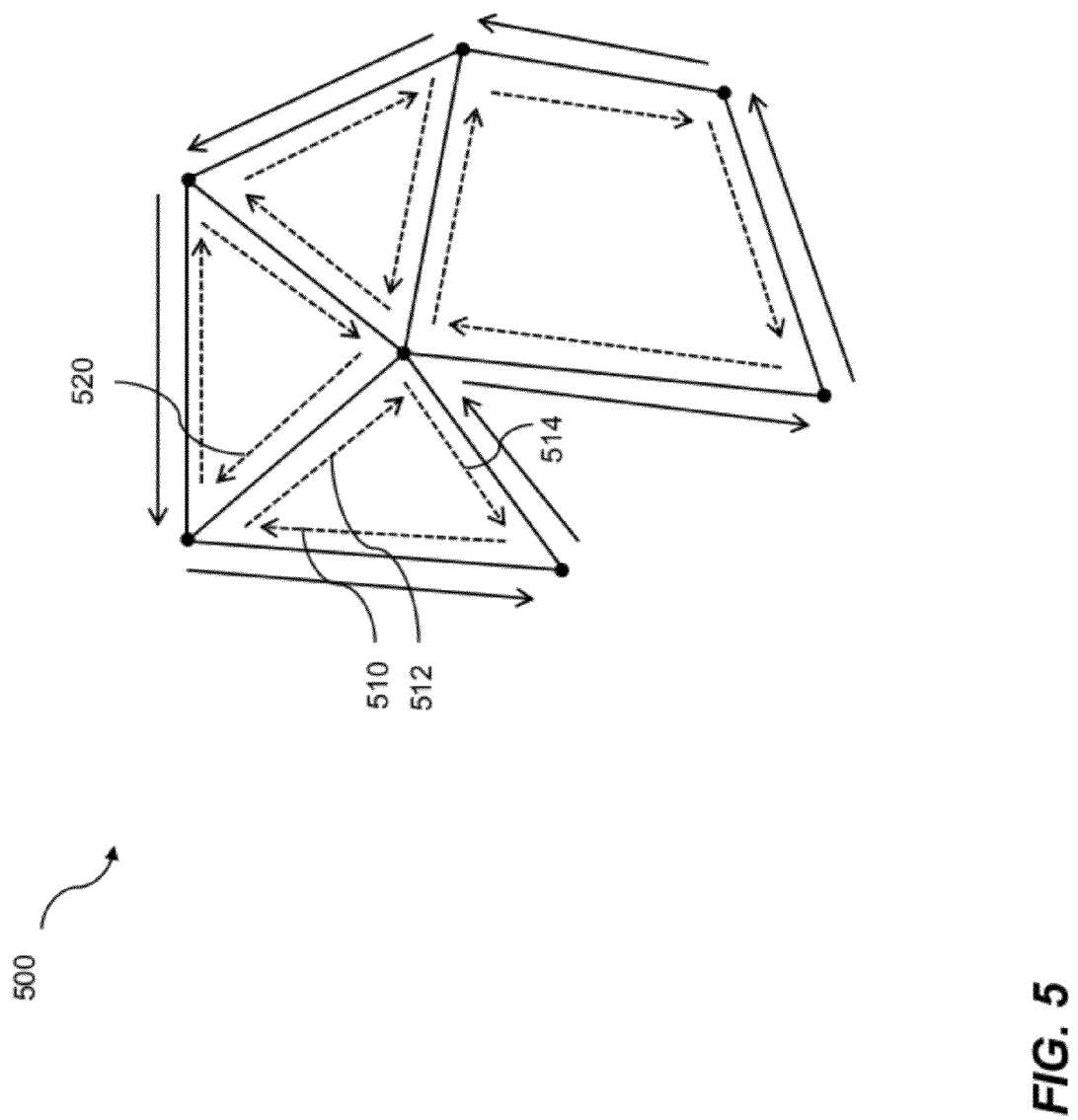
FIG. 5 is a diagram showing graph traversal.

FIG. 5 is a diagram showing graph traversal. A graph 500 is shown with multiple vertices and edges. In some embodiments, edges within the graph are traversed in a clockwise fashion. For example, starting with edge direction 510, a cycle is completed following a first edge direction 510, followed by a second edge direction 512, followed by a third edge direction 514. When traversing the graph 500, a next edge is chosen for graph traversal based on the next edge being the next rightmost edge. In alternate embodiments, a next edge may be chosen for graph traversal based on the next edge being the next leftmost edge and wherein edges within the graph are traversed in an anticlockwise fashion. Each edge in the graph will be traversed a total of two times. For instance, the second edge direction 512 is used when completing one cycle in the clockwise direction. Then fourth edge direction 520 is used, on the same edge as was used by the second edge direction 512, when a neighboring cycle is completed in the clockwise direction. As can be seen, the second edge direction 512 is opposite to fourth edge direction 520. In embodiments, the graph 500 is comprised of vertices, representing rectangles in the layout, and edges, representing double pattern spacing conflicts. An even cycle includes an even number of edges. An odd cycle includes an odd number of edges. The cycles thus represent a plurality of edges. The plurality of cycles can be considered to each be a conflict cycle with the plurality of conflict cycles making up a graph. The plurality of conflict cycles may include a set of the smallest possible conflict cycles. In embodiments, only the odd cycles create a problem for double pattern lithography.

Figure 6:
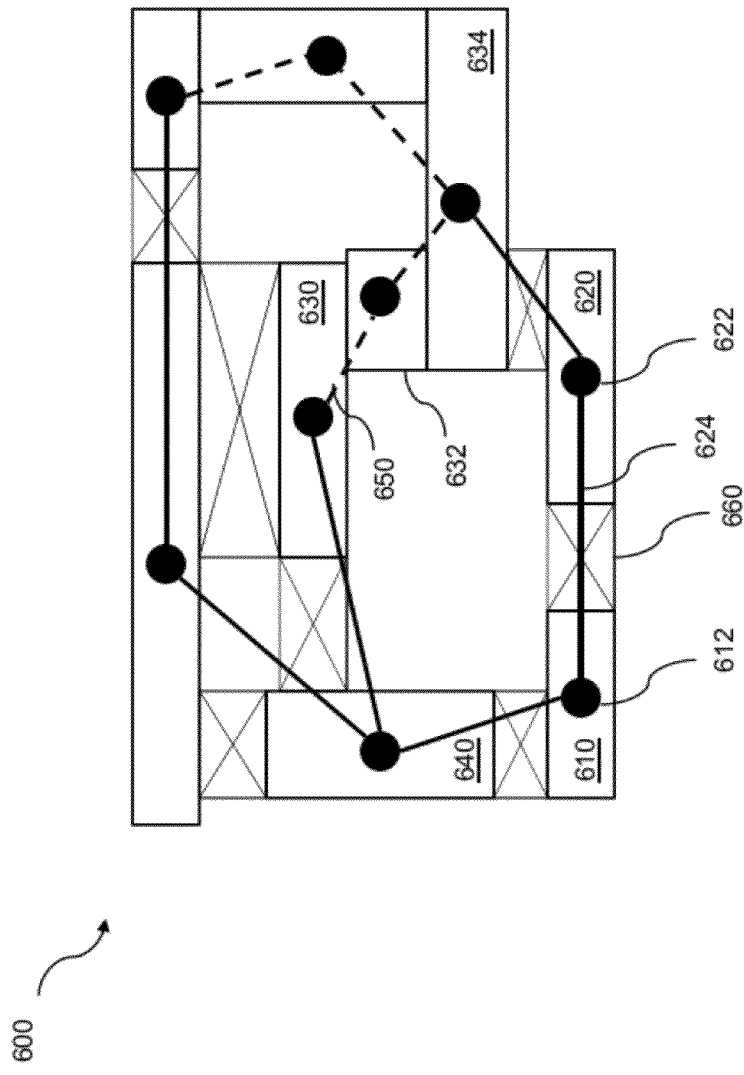
FIG. 6 is a diagram showing an example layout with edges and vertices.

FIG. 6 is a diagram showing an example layout with edges and vertices. A layout 600 is given which is composed of multiple polygons. The layout 600 includes a first rectangle 610, a second rectangle 620, a third rectangle 630, a fourth rectangle 632, a fifth rectangle 634, and a sixth rectangle 640. A spacing conflict between the first rectangle 610 and the second rectangle 620 is shown as a rectangle 660 with an "X" inside of it and is represented by a first edge 624. The vertex (e.g. 612 and 622) for each of the rectangles may be at the center point for each of the rectangles. A conflict between two polygons may be represented as an edge with a first line type in a graph. The first line type may include a solid edge or numerous other line types. The conflict may include a double pattern spacing conflict in the layout. Odd cycles may have an odd number of edges with the first line type.

The third rectangle 630 is attached to the fourth rectangle 632 which is attached to the fifth rectangle 634. Thus, the third rectangle 630, the fourth rectangle 632, and the fifth rectangle 634 comprise one shape in the layout which has been decomposed into these three respective rectangles. Contact of a pair of rectangles decomposed from a single polygon may be represented with a second edge 650 with a second line type in the graph. The second line type may include a dashed edge or numerous other line types. The edges with the second line type may contact vertices representing each of the pair of rectangles that comprise a single shape in the layout. In some embodiments, the vertices may be at center points for each of the pair of rectangles. In alternate embodiments, the vertices may be at a boundary of each of the pair of rectangles. The edge with a second line type may be included while traversing a cycle from the graph. In embodiments, only edges with the first line type are counted to determine that a cycle is odd. A cycle including the first edge 624 and the second edge 650 which includes the first rectangle 610, the second rectangle 620, the third rectangle 630, the fourth rectangle 632, the fifth rectangle 634, and the sixth rectangle 640 includes an even number of edges of the first line type. Therefore, this example cycle is even and therefore does not have a double pattern lithography problem.

Figure 7:
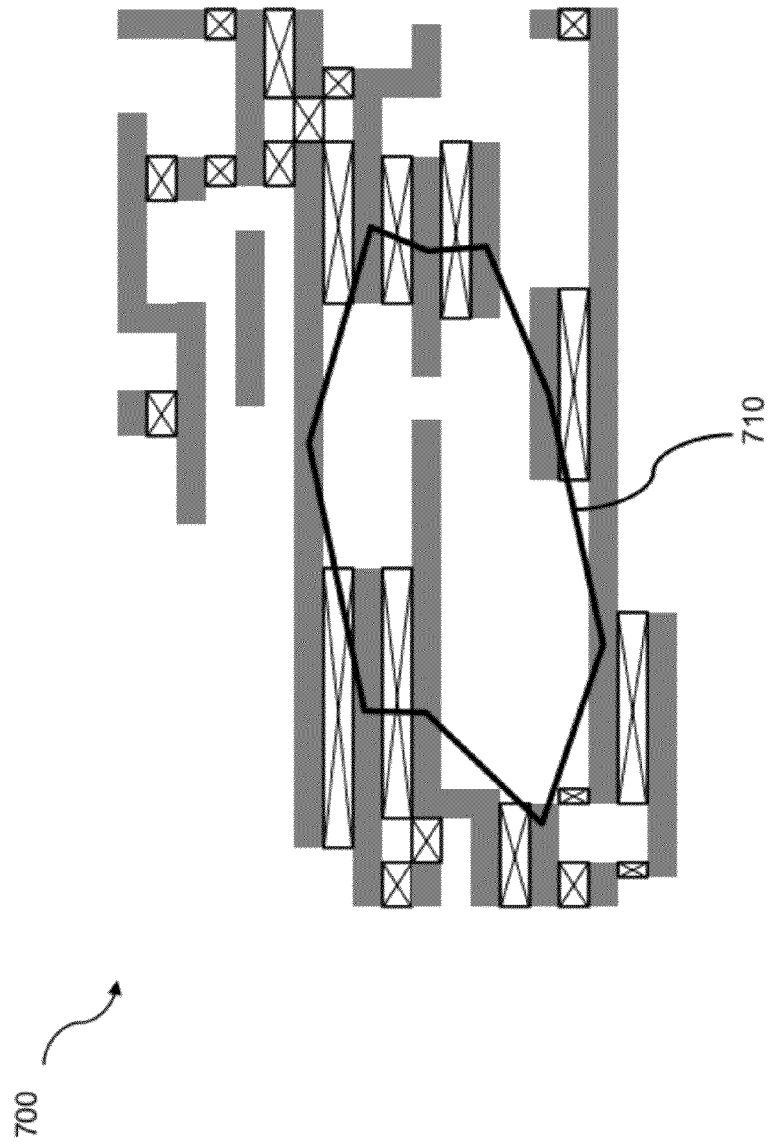
FIG. 7 is a diagram showing an example layout conflict cycle.

FIG. 7 is a diagram showing an example layout conflict cycle. A layout 700 is included with multiple polygons. In some embodiments, the layout may be for a 20 nm or smaller lithography. A cycle 710 is shown displaying conflicts between various polygons in the layout 700. The cycle 710 includes nine edges and therefore is an odd cycle. This odd cycle needs to be fixed in order to avoid a double pattern lithography violation.

Figure 8B:
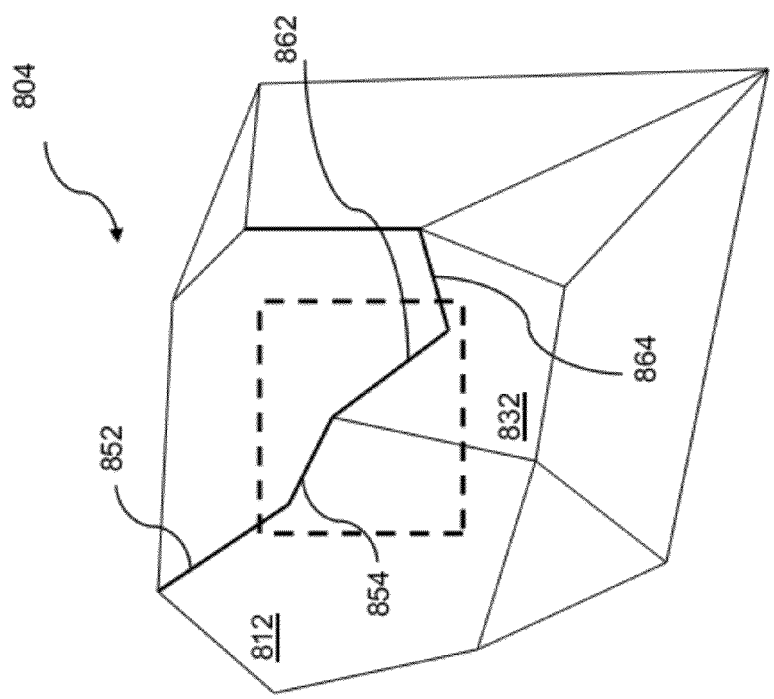
FIGS. 8A and 8B show an original graph and an incrementally updated graph, respectively.
Figure 8A:
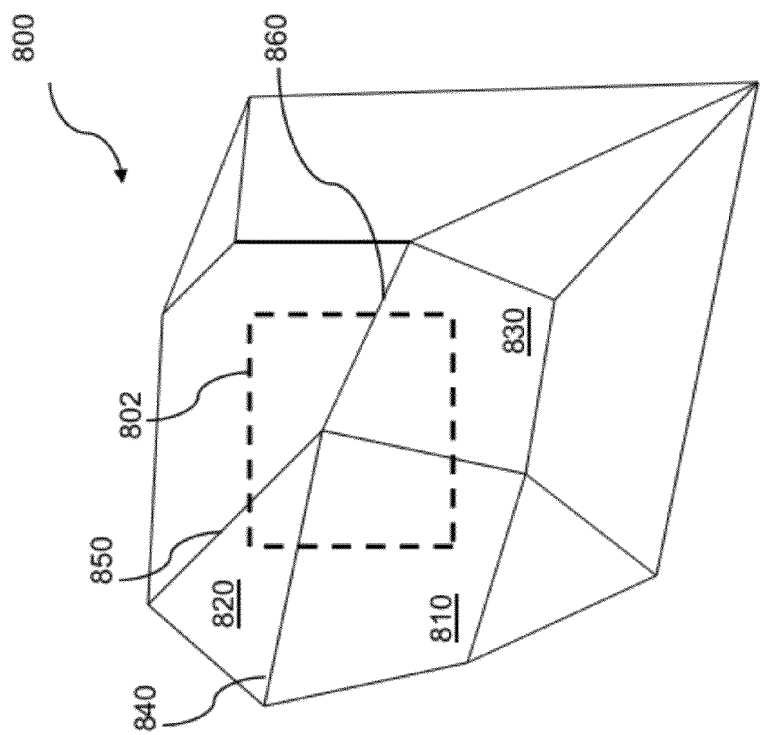

FIG. 8A is a diagram showing an example original graph 800. The graph 800 includes various cycles including a first cycle 810, a second cycle 820, and a third cycle 830. The identifying further comprises identifying a plurality of conflict cycles in the layout such as the first cycle 810, the second cycle 820, and the third cycle 830. A portion 802 of the layout is defined. The flow may further comprise performing an incremental change on the portion 802 of the layout and performing a local update of the graph.

FIG. 8B is a diagram showing the graph incrementally updated. A layout may be incrementally updated during various layout design processes including, for example redundant via insertion. The updated graph 804 can be seen to have a conflict edge 840 removed. Additionally a new vertex exists so that a previous edge 860 has become two edges as in a first new edge 862 and second new edge 864. Similarly, a previous edge 850 has become two edges as in a first new edge 852 and a second new edge 854. As a result, the previous first cycle 810 and second cycle 820 have become a single cycle 812. Likewise the previous third cycle 830 has become a new cycle 832. An effort is made to avoid odd cycle prone layout shapes. For instance, the addition of odd routing jogs is avoided where possible as well as other layout challenges.

Figure 9:
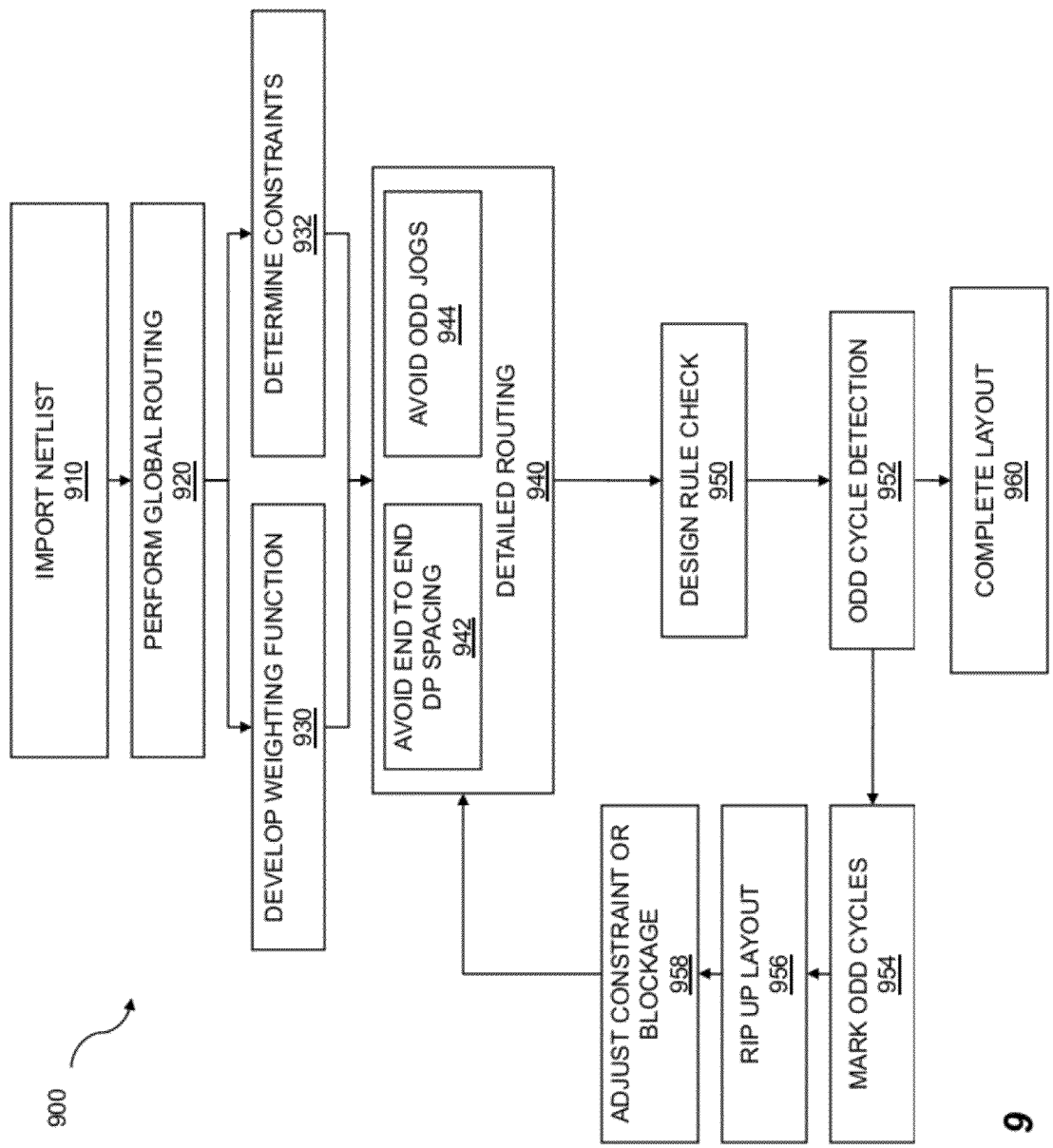
FIG. 9 is a flowchart for routing for correct layout.

FIG. 9 is a flowchart for routing for correct layout especially given double pattern lithography. A flow 900 describes a computer implemented method for routing. The flow 900 begins with importing a netlist 910 for a semiconductor circuit. The netlist may be in the form of Verilog, VHDL, or other design language. The netlist may describe connections between blocks, gates, or transistors within a semiconductor chip. The netlist may be imported into a database to be included with other information about the semiconductor circuit. In some embodiments, the netlist may already reside within a software tool and importing may be construed as using the netlist already present in the tool. The semiconductor circuit may comprise an entire semiconductor chip or a portion thereof. The flow 900 continues with performing routing 920 for the netlist wherein the routing is based on double pattern lithography rules. The routing may be broken down into global routing and detailed routing. The global routing may include determining channels for each net and an overall path for the net.

The flow 900 may include developing a weighting function 930 used to bias the routing away from double pattern lithography conflicts. The weighting function provides costs which are optimized as part of the routing effort. A weighting factor could be included to bias routing away from odd jog wiring, end-to-end double pattern spacing, and other configurations that can create problems for double pattern lithography. The flow 900 may include determining constraints 932 in the routing. In some embodiments, odd jog wiring, end-to-end double pattern spacing, or other configurations that can create problems for double pattern lithography are mandated to be avoided and therefore a constraint for such a structure is included. The routing may include detailed routing 940. Detailed routing may include exact routing and specific layers for each net. In some embodiments, the detailed routing is where wiring optimization occurs to avoid double pattern lithography conflicts. The routing may avoid end-to-end double pattern spacing 942. By way of example, in FIG. 6, a first rectangle 610 and second rectangle 620 have a double pattern spacing conflict. The routing may avoid odd jogs 944. In some embodiments, even jogs may be allowed in the routing. An example of an odd jog will be provided in FIG. 10. In some embodiments, global routing 920 for the netlist may be performed before the detailed routing is performed. In other embodiments, routing may be accomplished in one step. The flow 900 may include performing design rule checking (DRC) 950 on layout after the routing is performed. DRCs can check for various shape width, shape spacing, specific shapes, and other layout checks. The flow 900 may include performing odd cycle detection 952 on a layout of the netlist after the routing is performed. In some cases odd cycle violations may exist after detailed routing. These odd cycle violations should be corrected before a design is finalized. Typical fixes to odd cycle conflicts are rerouting, increased spacing, creating even jogs, or the like. The flow 900 may include marking odd cycles 954 which were detected. The marking may include identifying which shapes have an odd cycle conflict between them. A graph representing the odd cycle may be included as part of the analysis. Odd cycle detection may comprise decomposing the layout into rectangles, representing each of the rectangles as a vertex in a graph, representing relationships between the rectangles as edges in the graph, and identifying double pattern lithography violations using the edges in the graph. Many aspects from the flow 100 of FIG. 1 can be used in this odd cycle analysis.

The flow 900 may include ripping up a portion of the layout 956 where the odd cycles were marked. In some embodiments, only a small part of the layout may require ripping up. The flow 900 may include adjusting a constraint 958 on the routing. Such a constraint could be moving a block to which a wire needs to be connected, increasing space allocated for wiring, allowing wiring on an additional level, and so on. The flow 900 may include adjusting a blockage 958 for the routing. Certain logical blocks may have blockage over them but there may be a limited amount of wiring which can be used. By modifying such blockage requirements, routing may be accomplished that avoids double pattern conflicts. The flow 900 may include repeating the routing based on the double pattern lithography rules. The flow 900 may include completing the layout 960. In some embodiments, the routing may be completed for the netlist that was imported. In other embodiments, one or more double pattern violations may remain and another tool or manual designer intervention may be required to finalize the routing.

Figure 10B:
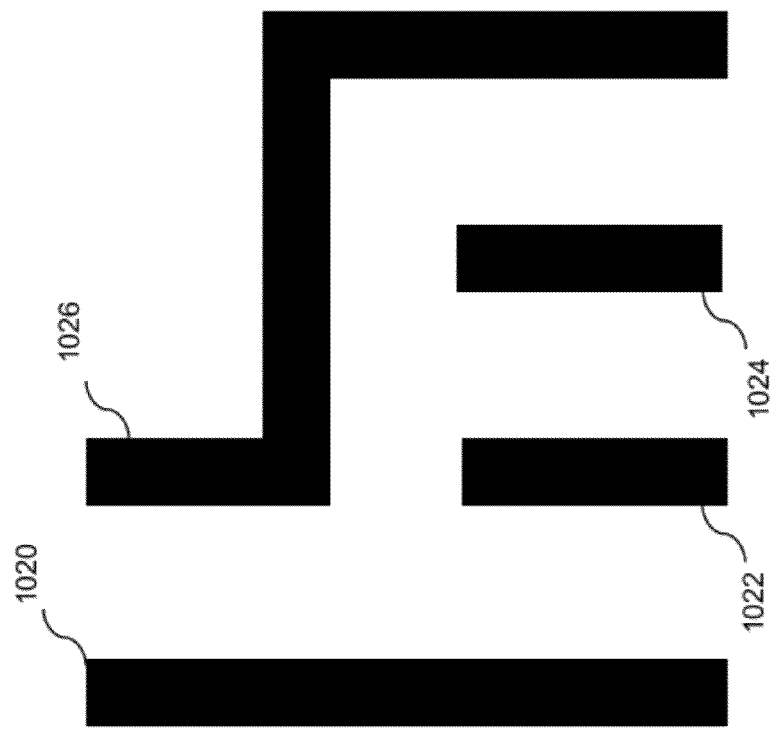
FIGS. 10A and 10B show diagrams of odd and even jog routing.
Figure 10A:
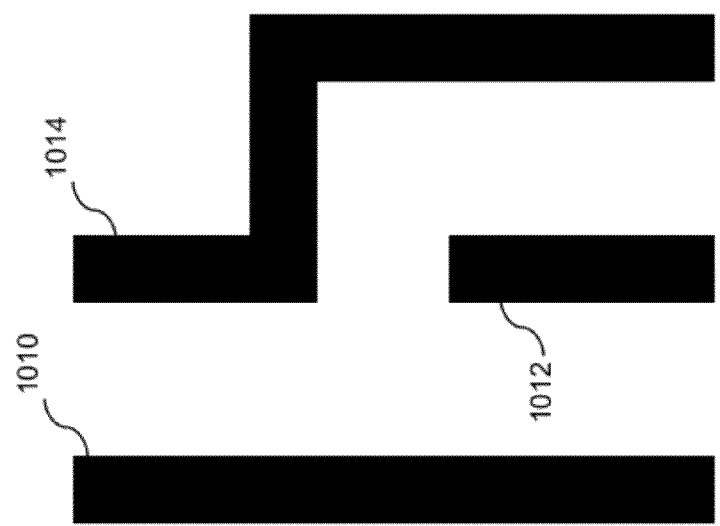

FIGS. 10A and 10B show diagrams of odd and even jog routing. FIG. 10A includes a first wiring shape 1010, a second wiring shape 1012, and a third wiring shape 1014. In FIG. 10A, the third wiring shape 1014 jogs over one wiring track so as to not connect with the second wiring shape 1012. The jog for the third wiring shape 1014 is for a single wiring track and therefore is called an odd jog. An odd jog occurs where a wire jogs over by one, three, five, or some other odd number of wiring tracks.

FIG. 10B includes a first wiring shape 1020, a second wiring shape 1022, a third wiring shape 1024, and a fourth wiring shape 1026. In FIG. 10B, the fourth wiring shape 1026 jogs over two wiring tracks so as to not connect with the second wiring shape 1022 nor the third wiring shape 1024. The jog for the fourth wiring shape 1026 is for two wiring track and therefore is called an even jog. An even jog would be where a wire jogs over by two, four, six, or some other even number of wiring tracks.

An odd cycle violation can exist in FIG. 10A between the first wiring shape 1010, the second wiring shape 1012, and the third wiring shape 1014. A double pattern violation can exist between each of the shapes and cannot be solved with two separate masks. This type of a challenge illustrates why odd jogs should be avoided.

When an even jog is uses, as in the case of FIG. 10B. The first wiring shape 1020 and the third wiring shape 1024 can be fabricated using one mask. The second wiring shape 1022 and the fourth wiring shape 1026 can be fabricated using a second mask. In this manner, double pattern conflicts are avoided and the benefit of even jogs can be seen.

Figure 11:
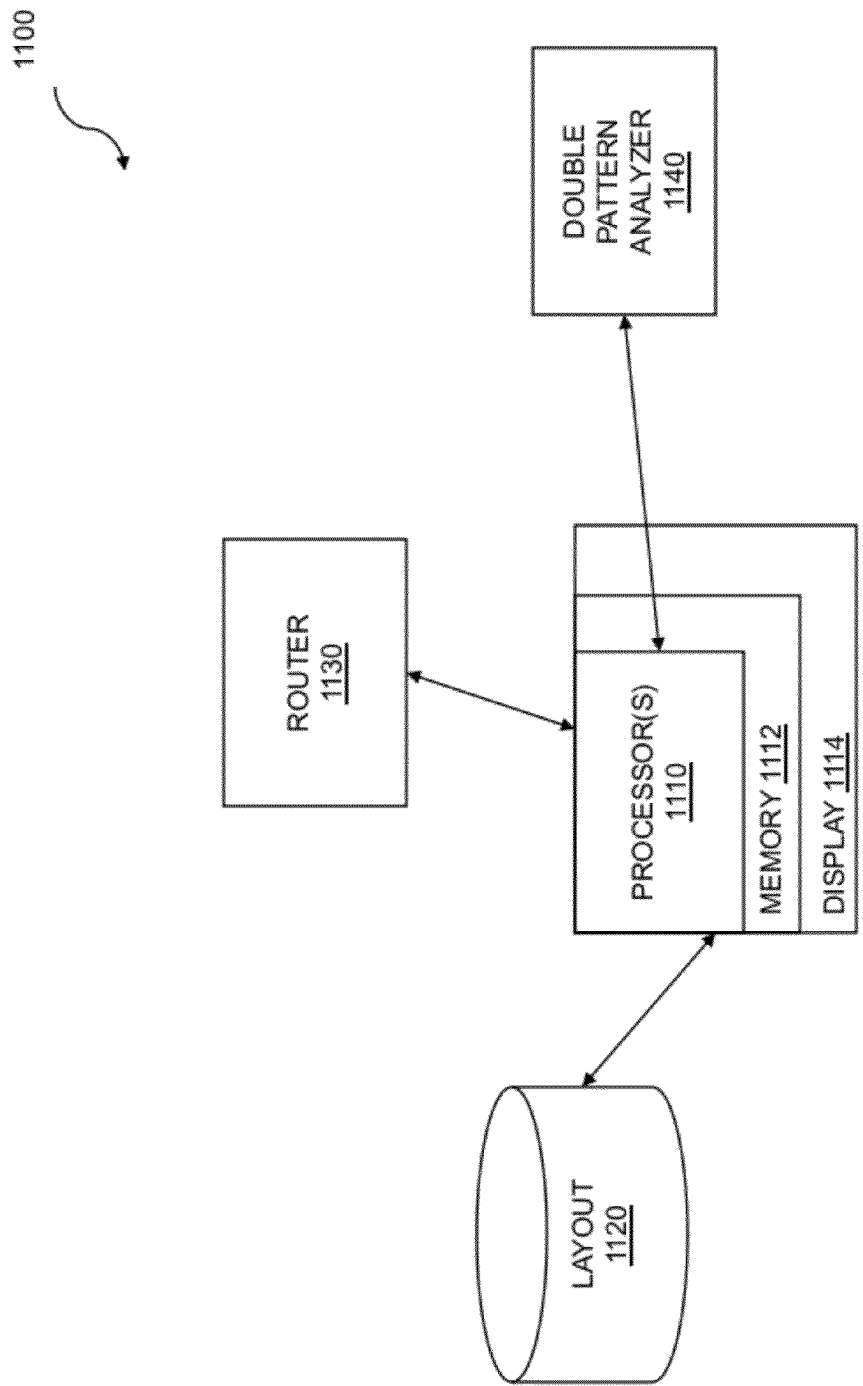
FIG. 11 is a diagram of a system for double pattern lithography analysis.

FIG. 11 is a diagram of a system 1100 for double pattern lithography analysis. Routing and lithography analysis may be performed by one or more processors 1110. The processors 1110 may execute instructions stored in one or more memories 1112. The memories 1112 may be used for storing instructions, for temporary data storage, for system support, and the like. The resulting layout 1120, analysis, netlists, schematics, and the like may be shown in a display 1114 that is attached to the processors 1110. The processors 1110 may read in or import the semiconductor layout 1120 for use in the analysis. In other embodiments, the layout 1120 may be generated as part of the design process based on netlists, schematics, and the like. The router 1130 may generate correct layout that avoids odd cycle double pattern lithography violations. In some embodiments, a double pattern analyzer 1140 may analyze the layout 1120 which was imported or generated. The double pattern analyzer 1140 may provide corrections to the layout 1120 or provide recommendations for possible corrections. In some embodiments, the router 1130 and/or the double pattern analyzer 1140 may include, be performed by, or be controlled by the processor 1110.

Each of the above methods may be executed on one or more processors on one or more computer systems. Embodiments may include various forms of distributed computing, client/server computing, and cloud based computing. Further, it will be understood that for each flowchart in this disclosure, the depicted steps or boxes are provided for purposes of illustration and explanation only. The steps may be modified, omitted, or re-ordered and other steps may be added without departing from the scope of this disclosure. Further, each step may contain one or more sub-steps. While the foregoing drawings and description set forth functional aspects of the disclosed systems, no particular arrangement of software and/or hardware for implementing these functional aspects should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. Each element of the block diagrams and flowchart illustrations, as well as each respective combination of elements in the block diagrams and flowchart illustrations, illustrates a function, step or group of steps of the methods, apparatus, systems, computer program products and/or computer-implemented methods. Any and all such functions may be implemented by computer program instructions, by special-purpose hardware-based computer systems, by combinations of special purpose hardware and computer instructions, by combinations of general purpose hardware and computer instructions, by a computer system, and so on. Any and all of which implementations may be generally referred to herein as a "circuit," "module," or "system."

A programmable apparatus that executes any of the above mentioned computer program products or computer implemented methods may include one or more processors, microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are not limited to applications involving conventional computer programs or programmable apparatus that run them. It is contemplated, for example, that embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized. The computer readable medium may be a non-transitory computer readable medium for storage. A computer readable storage medium may be electronic, magnetic, optical, electromagnetic, infrared, semiconductor, or any suitable combination of the foregoing. Further computer readable storage medium examples may include an electrical connection having one or more wires, a portable computer diskette, a hard disk, a random access memory (RAM), a read-only memory (ROM), an erasable programmable read-only memory (EPROM), Flash, MRAM, FeRAM, phase change memory, an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed more or less simultaneously to enhance utilization of the processor and to facilitate substantially simultaneous functions. By way of implementation, any and all methods, program codes, program instructions, and the like described herein may be implemented in one or more thread. Each thread may spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the entity causing the step to be performed.

While the invention has been disclosed in connection with preferred embodiments shown and described in detail, various modifications and improvements thereon will become apparent to those skilled in the art. Accordingly, the spirit and scope of the present invention is not to be limited by the foregoing examples, but is to be understood in the broadest sense allowable by law.

What is claimed is:

1. A computer implemented method for layout design comprising:
    importing a layout for a layer within a semiconductor chip wherein the layout is comprised of two-dimensional polygons;
    decomposing, using one or more processors, the layout into rectangles;
    representing each of the rectangles as a vertex in a graph;
    representing relationships between the rectangles as edges in the graph;
    identifying double pattern lithography violations using the edges in the graph where each edge in the graph is traversed a total of two times, wherein the total of two times that each edge in the graph is traversed are in opposite directions; and
    performing a local update of the graph based on the double pattern lithography violations identified.

2. The method according to claim 1 wherein only odd cycles are used as part of the identifying.

3. The method according to claim 1 further comprising representing a conflict between two polygons as an edge with a first line type in the graph.

4. The method according to claim 3 wherein the conflict includes a double pattern spacing conflict in the layout.

5. The method according to claim 4 wherein odd cycles have an odd number of edges with the first line type.

6. The method according to claim 3 further comprising representing contact of a pair of rectangles decomposed from a single polygon with an edge with a second line type in the graph.

7. The method according to claim 6 wherein the edge with a second line type is included while traversing a cycle from the graph.

8. The method according to claim 6 wherein only edges with the first line type are counted to determine that a cycle is odd.

9. The method according to claim 6 wherein the edges with the second line type contact vertices representing each of the pair of rectangles.

10. The method according to claim 1 wherein a next edge is chosen for graph traversal based on the next edge being a next rightmost edge.

11. The method according to claim 1 wherein the identifying further comprises identifying a plurality of conflict cycles in the layout.

12. The method according to claim 11 wherein the plurality of conflict cycles include a set of smallest possible conflict cycles.

13. The method according to claim 1 wherein the identifying further comprises performing a linear search for the double pattern lithography violations.

14. The method according to claim 1 further comprising fixing one or more of the double pattern lithography violations by increasing spacing between two of the rectangles that were decomposed from the layout.

15. The method according to claim 1 further comprising fixing one or more of the double pattern lithography violations by rerouting a shape from the layout that was decomposed into rectangles.

16. The method according to claim 1 wherein the performing the local update of the graph is reflected in a performing of an incremental change on a portion of the layout.

17. A computer program product embodied in a non-transitory computer readable medium for layout design comprising:
    code for importing a layout for a layer within a semiconductor chip wherein the layout is comprised of two-dimensional polygons;
    code for decomposing the layout into rectangles;
    code for representing each of the rectangles as a vertex in a graph;
    code for representing relationships between the rectangles as edges in the graph;
    code for identifying double pattern lithography violations using the edges in the graph where each edge in the graph is traversed a total of two times, wherein the total of two times that each edge in the graph is traversed are in opposite directions; and
    code for performing a local update of the graph based on the double pattern lithography violations identified.

18. The computer program product according to claim 17 wherein only odd cycles are used as part of the identifying.

19. The computer program product according to claim 17 further comprising code for representing a conflict between two polygons as an edge with a first line type in the graph.

20. The computer program product according to claim 19 wherein the conflict includes a double pattern spacing conflict in the layout.

21. The computer program product according to claim 17 wherein the local update of the graph includes inserting a new vertex so that a previous edge becomes two edges.

22. The computer program product according to claim 17 wherein the local update of the graph includes making a previous first cycle and a previous second cycle become a single cycle.

23. The computer program product according to claim 17 wherein the performing the local update of the graph is reflected in a performing of an incremental change on a portion of the layout.

24. A computer system for layout design comprising:
a memory for storing instructions;
one or more processors attached to the memory wherein the one or more processors are configured to:
import a layout for a layer within a semiconductor chip wherein the layout is comprised of two-dimensional polygons;
decompose the layout into rectangles;
represent each of the rectangles as a vertex in a graph;
represent relationships between the rectangles as edges in the graph;
identify double pattern lithography violations using the edges in the graph where each edge in the graph is traversed a total of two times, wherein the total of two times that each edge in the graph is traversed are in opposite directions; and
perform a local update of the graph based on the double pattern lithography violations identified.

25. The system according to claim 24 wherein only odd cycles are used to identify the double pattern lithography violations.

26. The system according to claim 24 wherein the one or more processors are further configured to represent a conflict between two polygons as an edge with a first line type in the graph.

27. The system according to claim 26 wherein the conflict includes a double pattern spacing conflict in the layout.

* * * * *